United States Patent
Seon

(10) Patent No.: US 10,483,751 B2
(45) Date of Patent: Nov. 19, 2019

(54) TRIP CONTROL CIRCUIT FOR CIRCUIT BREAKER

(71) Applicant: LSIS CO., LTD., Anyang-si, Gyeonggi-do (KR)

(72) Inventor: Jongkug Seon, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 310 days.

(21) Appl. No.: 15/495,913

(22) Filed: Apr. 24, 2017

(65) Prior Publication Data

US 2017/0317483 A1 Nov. 2, 2017

(30) Foreign Application Priority Data

Apr. 28, 2016 (KR) .................... 10-2016-0052310

(51) Int. Cl.
*H02H 3/08* (2006.01)
*G01R 15/18* (2006.01)
(Continued)

(52) U.S. Cl.
CPC .............. *H02H 3/08* (2013.01); *G01R 15/183* (2013.01); *G01R 19/16538* (2013.01); *H02H 1/0007* (2013.01); *B60L 3/0069* (2013.01); *G01R 19/0015* (2013.01); *H01F 38/28* (2013.01); *H02H 3/33* (2013.01); *H02H 3/347* (2013.01)

(58) Field of Classification Search
USPC ..................................................... 361/42–50
See application file for complete search history.

(56) References Cited

U.S. PATENT DOCUMENTS 4,276,510 A 6/1981 Tompkins et al.
4,280,162 A * 7/1981 Tanka .................... H02H 3/332
324/117 R
(Continued)

FOREIGN PATENT DOCUMENTS

CN 104931758 A 9/2015
EP 2568494 3/2013
(Continued)

OTHER PUBLICATIONS

Korean Intellectual Property Office Search report dated Apr. 22, 2016, 3 pages.
(Continued)

*Primary Examiner* — Danny Nguyen
(74) *Attorney, Agent, or Firm* — K&L Gates LLP

(57) ABSTRACT

The present invention provides a trip control circuit for a circuit breaker capable of breaking a circuit when a fault current occurs due to a DC current component, as well as an AC current. The trip control circuit comprises a current transformer that has a core allowing a circuit to pass through and a secondary coil for detecting a current flowing on the circuit and providing a current detection signal; an oscillation circuit section that configured to apply an electrical signal to the secondary coil to increase a slope of a hysteresis loop of the current transformer to allow the secondary coil to detect a DC current and an AC current; and a trip determining circuit section that configured to compare a current value indicated by the current detection signal with a predetermined reference current value.

9 Claims, 6 Drawing Sheets

(51) Int. Cl.
*G01R 19/165* (2006.01)
*H02H 1/00* (2006.01)
*H02H 3/347* (2006.01)
*H01F 38/28* (2006.01)
*G01R 19/00* (2006.01)
*H02H 3/33* (2006.01)
*B60L 3/00* (2019.01)

(56) References Cited

U.S. PATENT DOCUMENTS

| | | | |
|---|---|---|---|
| 5,223,789 A | 6/1993 | Katsuyama et al. | |
| 2011/0273139 A1* | 11/2011 | Hofheinz | B60L 3/0023 320/109 |
| 2013/0162242 A1* | 6/2013 | Goinga | G01R 15/183 324/127 |
| 2014/0320112 A1* | 10/2014 | Nodera | G01R 15/183 324/127 |

FOREIGN PATENT DOCUMENTS

| | | |
|---|---|---|
| EP | 3121609 A1 | 1/2017 |
| GB | 1369817 A | 10/1974 |
| IE | 20220276 U1 | 6/2003 |
| JP | H03191870 A | 8/1991 |
| JP | 09-224328 | 8/1997 |
| JP | 11-289613 | 10/1999 |
| JP | 2005158559 | 6/2005 |
| JP | 2007220382 | 8/2007 |
| JP | 2011182536 A | 9/2011 |
| JP | 2012125053 A | 6/2012 |
| JP | 2013038047 A | 2/2013 |
| JP | 2013178205 A | 9/2013 |
| KR | 1986-0002721 | 10/1986 |
| KR | 100960498 | 6/2010 |
| KR | 101379813 | 3/2014 |
| WO | 2015139654 A1 | 9/2015 |

OTHER PUBLICATIONS

Chinese Office Action for related Chinese Application No. 201710278984.3; action dated Jul. 20, 2018; (7 pages).
European Search Report for related European Application No. 17165951.9; report dated Oct. 11, 2017; (8 pages).
Japanese Office Action for related Japanese Application No. 2017-089811; action dated Feb. 27, 2018; (3 pages).

* cited by examiner

TRIP CONTROL CIRCUIT FOR CIRCUIT BREAKER

CROSS-REFERENCE TO RELATED APPLICATION

Pursuant to 35 U.S.C. § 119(a), this application claims the benefit of earlier filing date and right of priority to Korean Application No. 10-2016-0052310, filed on Apr. 28, 2016, the contents of which is incorporated by reference herein in its entirety.

BACKGROUND OF THE DISCLOSURE

1. Field of the Disclosure

The present disclosure relates to a trip control circuit for a circuit breaker, and particularly, to the trip control circuit for a circuit breaker capable of breaking a circuit when an overcurrent of alternating current (AC) or direct current (DC) or an electric leakage of AC or DC occurs, by detecting even a DC current component flowing on a circuit which cannot has been detected by an existing circuit breaker, as well as an AC flowing on the circuit.

2. Background of the Disclosure

A circuit breaker is an electric device for breaking a circuit when an overcurrent occurs in at least any one phase current or unbalancing occurs among multi poles (phases) currents due to an electric leakage in a multi-pole AC electric power circuit, typically, a three-phases AC electric power circuit (hereinafter, simply abbreviated as a "circuit").

In particular, a circuit breaker capable of breaking an electric leakage is called an earth leakage circuit breaker (ELCB).

In such a circuit breaker, a current transformer is used as a means for detecting a phase current of the circuit, and in the case of the earth leakage circuit breaker, a zero phase current transformer (ZCT) is used to detect an amount of an electric leakage current. The circuit breaker compares a value of a phase current of the circuit detected by the current transformer with a preset reference current value, and when the detected value of the phase current is the reference current value or greater, the circuit breaker breaks the circuit. Also, in the case of the earth leakage circuit breaker, the ZCT compares a detected value of an electric leakage current with a preset reference electric leakage current, and when the detected electric leakage current value is the reference electric leakage current value or greater, the earth leakage circuit breaker breaks the circuit.

A circuit configuration of a circuit breaker according to an example of the related art will be described with reference to FIG. 1.

In FIG. 1, an AC current provided from the AC electric power source 10 flows to an electric load 50 through a circuit.

These days, an electric load in which only an AC current flows is hardly present, and a non-linear load of a DC component such as LED lighting, a modern control device, an electric power electronic device, an inverter/converter, and the like, occupies more than a half of the entire load. Thus, as can be referred to with reference to FIG. 1, load currents (i1, i2) flowing to the load 50 are formed as an AC current and a DC current simultaneously flow.

A current detecting means 20 can includes a ring-shaped core installed such that a circuit passes through and a secondary coil 30 wound around the ring-shaped core and for providing a current detection signal proportional to a phase current or an electric leakage current flowing through the circuit. A control circuit section 60-1 is connected to a secondary coil 30 of the current detecting means 20 to receive a current detection signal (Ic) from the secondary coil 30, and when a phase current value or an electric leakage current value indicated by the current detection signal (Ic) is a preset reference current value or greater, the control section 60-1 outputs a trip control signal. The trip control signal magnetizes a coil included in a trip mechanism such as a magnetic trip device, and moves a plunger, an output section, by using a magnetic driving force of the corresponding coil to trigger a switching mechanism 40 to perform a trip operation. Then, the switching mechanism 40 including a movable contact and a fixed contact operates to a circuit opening position to break the circuit, that is, performs a trip operation.

However, in the circuit breaker as illustrated in FIG. 1, the current detecting means 20 is a sort of transformer, and thus, it is able to detect an AC component of a circuit, but a DC component flowing on the load 50 is not induced to a secondary coil, and thus, it is impossible to detect the DC component.

Thus, the trip control circuit of a circuit breaker according to the related art is not able to break the circuit in the occurrence of overcurrent of a DC component flowing on a load or an electric leakage.

SUMMARY OF THE DISCLOSURE

Therefore, an object of the this invention is to provide a trip control circuit for a circuit breaker capable of breaking a circuit in the occurrence of an overcurrent of a DC component or an electric leakage, as well as breaking the circuit in the occurrence an overcurrent of an AC component or an electric leakage due to the AC component short circuit, by detecting both a DC component and an AC component of a current flowing on the circuit.

To achieve above object of the invention, a trip control circuit for a circuit breaker according to this invention is provided, the trip control circuit comprising: a current transformer that has a ring-shaped core allowing a circuit to pass through and a secondary coil wound around the core for detecting a current flowing on the circuit and providing a current detection signal; an oscillation circuit section that configured to apply an electrical signal to the secondary coil of the current transformer to increase a slope of a hysteresis loop of the current transformer to allow the secondary coil to detect a DC current, as well as an AC current, flowing on the circuit; and a trip determining circuit section that configured to compare a current value indicated by the current detection signal having an AC component and a DC component output from the secondary coil of the current transformer with a predetermined reference current value, and output a trip control signal when the current value indicated by the current detection signal exceeds the reference current value.

According to an aspect of this disclosure, the trip control circuit for a circuit breaker according to this disclosure further comprises a sensing resistor connected to the secondary coil of the current transformer that converts a current signal as a current detection signal provided by the secondary coil into a voltage signal, and outputs the converted voltage signal.

According to another aspect of this disclosure, the electrical signal applied by the oscillation circuit section is configured with a square wave signal.

According to still another aspect of this disclosure, the electrical signal applied by the oscillation circuit section is configured with a sine wave signal having high frequency.

According to still another aspect of this disclosure, the trip determining circuit section is configured to determine a current amount flowing on the circuit according to a change in time on the basis of the current detection signal, and determine a waveform and a frequency of the electrical signal to be supplied to the secondary coil through the oscillation circuit section.

According to still another aspect of this disclosure, the trip determining circuit section is configured to determine a signal of a waveform to be output by the oscillation circuit section on the basis of a relationship between a change in a magnetic field intensity generated in the secondary coil as time passed and a change in a magnetic flux density corresponding thereto.

According to still another aspect of this disclosure, the trip control circuit for a circuit breaker according to this disclosure further comprises a first display unit that displays a magnetic flux density and a magnetic field intensity of the secondary coil corresponding to a signal applied by the oscillation circuit section to the secondary coil.

According to still another aspect of this disclosure, the trip control circuit for a circuit breaker according to this disclosure further comprises a second display unit that configured to display an information indicating that a DC component is detected, when the DC component flowing on the circuit passing through the core of the current transformer is detected.

According to still another aspect of this disclosure, the trip determining circuit section is configured to receive a current detection signal from the secondary coil which has detected a current including at least one of a DC current component and an AC current component flowing on the circuit or a mixed current of the DC current and the AC current.

According to still another aspect of this disclosure, the trip determining circuit section comprises a low pass filter circuit section that removes a high frequency signal that may be mixed in the current detection signal for a current induced to the secondary coil.

Further scope of applicability of the present application will become more apparent from the detailed description given hereinafter. However, it should be understood that the detailed description and specific examples, while indicating preferred embodiments of the disclosure, are given by way of illustration only, since various changes and modifications within a scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF THE DISCLOSURE

Description will now be given in detail of the exemplary embodiments, with reference to the accompanying drawings. For the sake of brief description with reference to the drawings, the same or equivalent components will be provided with the same reference numbers, and description thereof will not be repeated.

Figure 1:
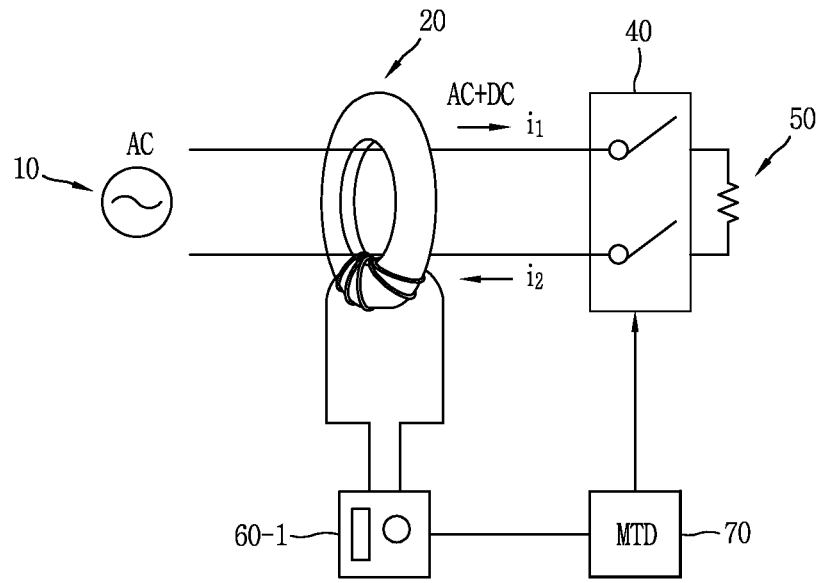
FIG. 1 is a block diagram illustrating a configuration of a trip control circuit for a circuit breaker according to the related art.
Figure 2:
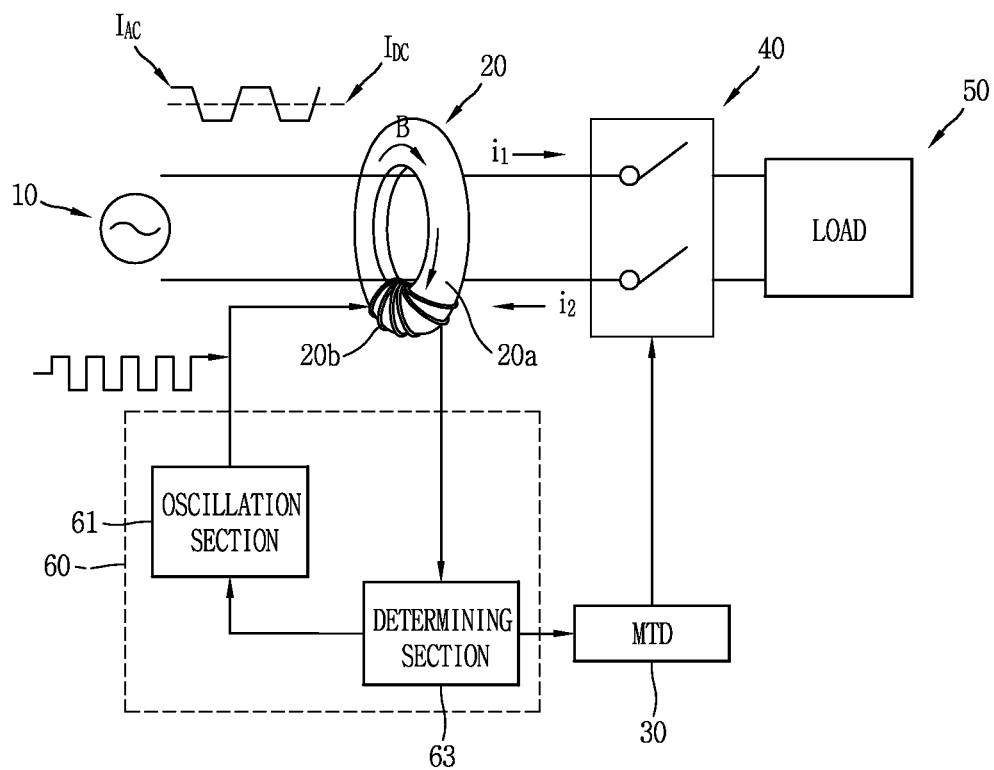
FIG. 2 is a block diagram illustrating a configuration of a trip control circuit for a circuit breaker according to a first embodiment of the present disclosure.

As illustrated in FIG. 2, a trip control circuit for a circuit breaker according to a first embodiment of the present disclosure comprises a current transformer 20, an oscillation circuit section 61, and a trip determining circuit section 63.

Figure 3:
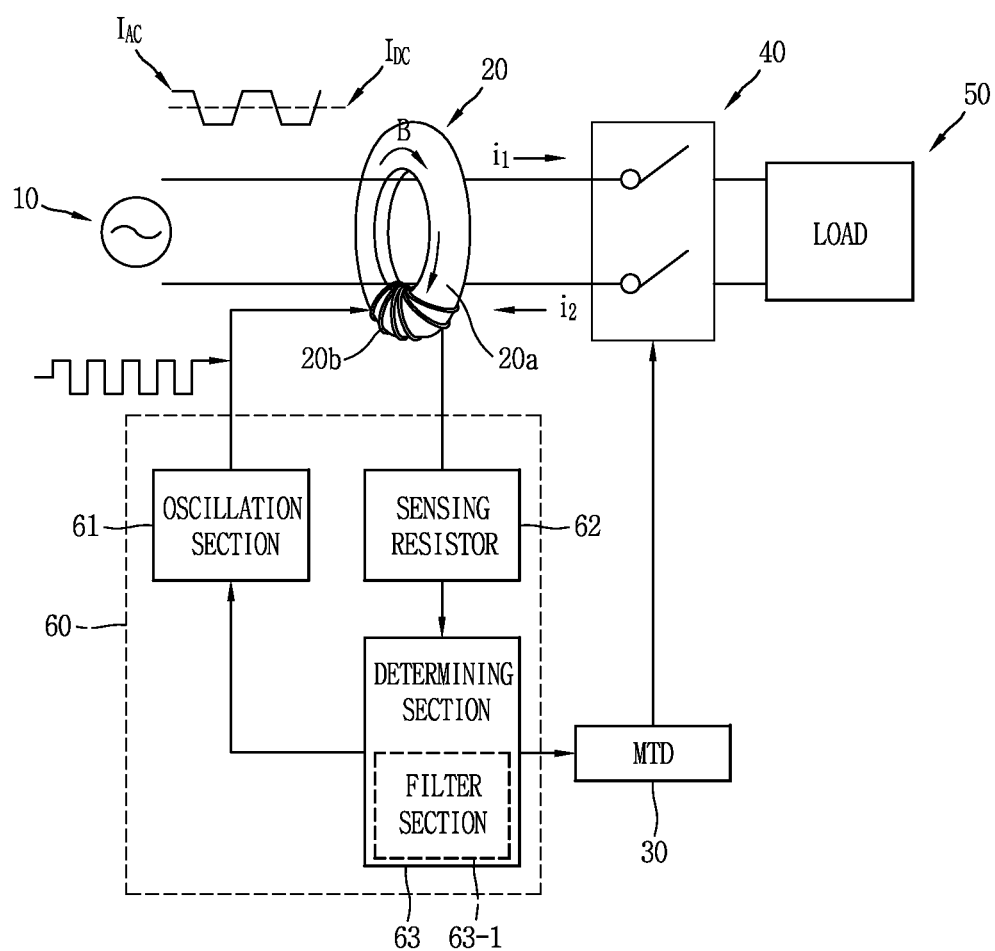
FIG. 3 is a block diagram illustrating a configuration of a trip control circuit for a circuit breaker according to a second embodiment of the present disclosure.
Figure 4:
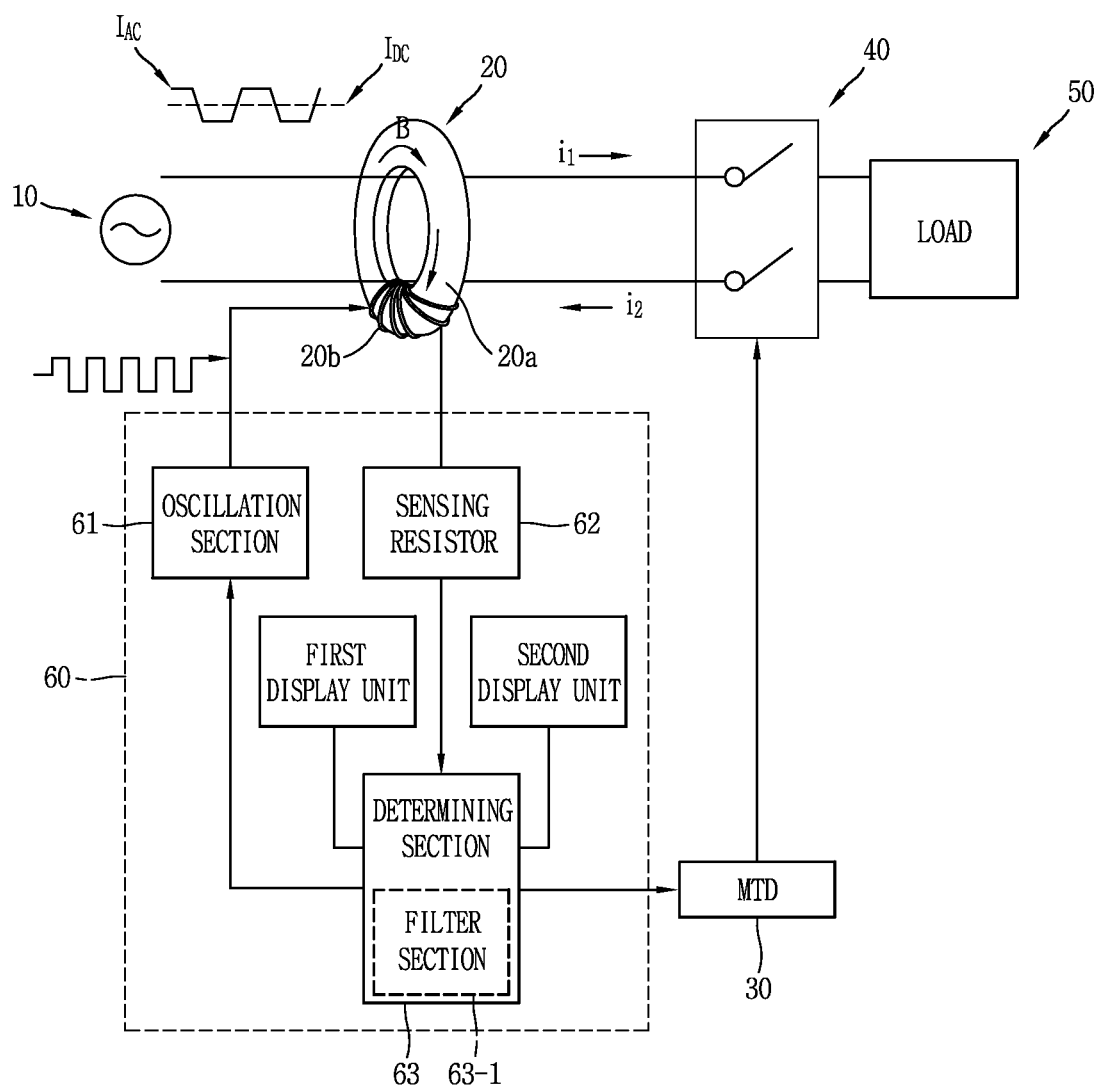
FIG. 4 is a block diagram illustrating a configuration of a trip control circuit for a circuit breaker according to a third embodiment of the present disclosure.

In FIGS. 2 to 4, reference numeral 60 denotes the trip control circuit section excluding the current transformer 20.

The current transformer 20 has a ring-shaped core 20a allowing a circuit to pass through and a secondary coil 20b wound around the core 20a, for detecting currents i1 and i2 flowing on the circuit, and for providing a current detection signal.

Here, the current transformer 20 can be replaced with a zero phase current transformer (abbreviated as ZCT) when the circuit breaker is an earth leakage circuit breaker.

Figure 6:
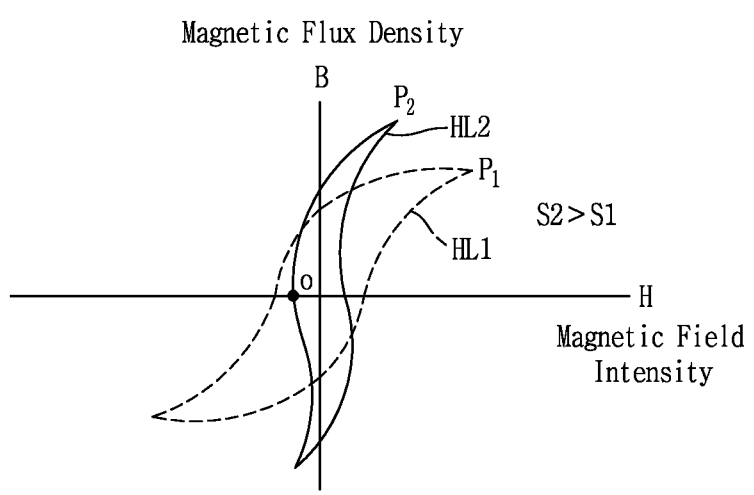
FIG. 6 is a view illustrating a comparison between a hysteresis loop HL1 of a current transformer in a state that an electrical signal is not applied to a secondary coil of the current transformer and a hysteresis loop HL2 of the current transformer in a state that an electrical signal is applied to the secondary coil of the current transformer in a trip control circuit for a circuit breaker according to the present disclosure.

FIG. 6 is a view illustrating a comparison between a hysteresis loop HL1 of a current transformer in a state that an electrical signal is not applied to a secondary coil of the current transformer and a hysteresis loop HL2 of the current transformer in a state that an electrical signal is applied to the secondary coil of the current transformer in a trip control circuit for a circuit breaker according to the present disclosure.

With reference to FIG. 6, when a slope of the hysteresis loop HL1 of a current transformer in a state that an electrical signal is not applied to the secondary coil is a first slope S1, the first slope S1 is small that a change in magnetic flux density B according to a change in an increase or decrease in a magnetic field intensity H is not rapid. Also, it can be seen that a saturation point P1 of the hysteresis loop HL1 is formed at a relatively large magnetic field intensity and a relatively low magnetic flux density, compared with a saturation point P2 of the hysteresis loop HL2.

Here, when a load current in which an AC component and a DC component are mixed flows with passing through the core of the current transformer having such characteristics of the hysteresis loop HL1, only an AC component is induced and output to the secondary coil corresponding to an output section of the current transformer, and a DC component is not induced to be output.

However, when an electrical signal having a waveform such as a square wave, for example, is applied through an oscillation circuit to the secondary coil of the current transformer, the hysteresis loop HL2 of the current transformer has a second slope S2 greater than the first slope S1. Also, a change in the magnetic flux density B according to a change in an increase or decreased in the magnetic field intensity H is rapid.

Also, it can be seen that a saturation point P2 of the hysteresis loop HL2 is formed in a relatively small magnetic field intensity and a relatively large magnetic flux density, compared with the saturation point P1 of the hysteresis loop HL1. Thus, it can be seen that when an electrical signal having a waveform such as a square wave, for example, is applied through the oscillation circuit to the secondary coil, a saturation point is also moved.

Thus, when the load current in which the AC component and the DC component are mixed flow with passing through the core of the current transformer having the characteristics of the hysteresis loop HL2 with a large slope, a DC component, as well as the AC component, is also induced and output to the secondary coil corresponding to the output section in the current transformer.

This characteristics can be seen through the waveforms of FIGS. 7 and 8 as described hereinafter with reference to FIGS. 7 and 8.

Figure 7:
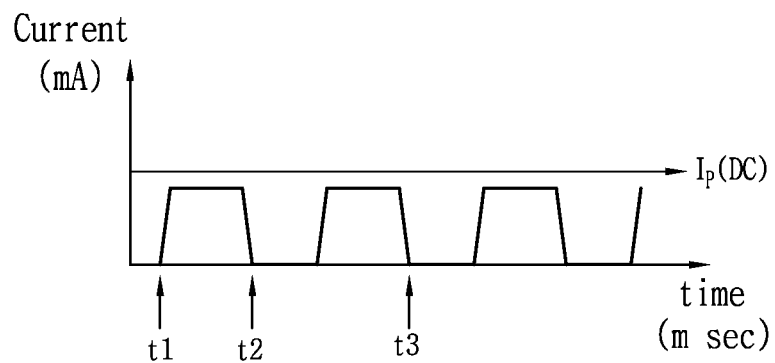
FIG. 7 is a waveform view illustrating a waveform regarding a DC component flowing on a circuit as an input signal of a current transformer and a waveform of a square wave applied from an oscillation circuit section in a trip control circuit for a circuit breaker according to the present disclosure.

In FIG. 7, it is assumed that when a current flowing on the circuit, that is, a current flowing on the load, is Ip, the Ip (DC) of the DC component has a waveform with a constant value over the lapse of time and a waveform of a square wave applied through the oscillation circuit section is the same as that illustrated below the waveform of the Ip (DC) of the DC component.

Figure 8:
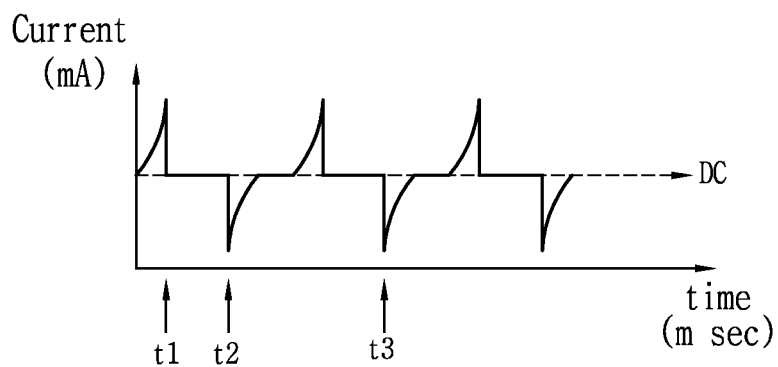
FIG. 8 is a waveform view of a detection output current output from a secondary coil of a current transformer in relation to a DC component flowing on a circuit in a trip control circuit for a circuit breaker according to the present disclosure.

Then, an output waveform of the secondary coil of the current transformer can be viewed through an oscilloscope as illustrated in FIG. 8.

As illustrated in FIGS. 7 and 8, it can be seen that distortion occurs at edges of the square wave at time points t1, t2, and t3 but DC waveforms having a predetermined current value are detected at most time duration excluding the time points at which distortion occurs.

Also, since the distortion can be removed by a low pass filter circuit section 63-1 (see FIG. 3 or 4) included in the trip determining circuit section 63, and thus, there is no problem to detect a DC component flowing on the circuit.

As mentioned above, the present invention is based on the fact that, when an electrical signal is applied to the secondary coil of the current transformer, a DC component, as well as an AC component, may be detected as a slope of a hysteresis loop of the current transformer is increased.

In the trip control circuit for a circuit breaker according to the present disclosure, hysteresis loop characteristics of the current transformer 20 in the trip control circuit for a circuit breaker according to the present disclosure may be expressed as Equation 1.

$$B(H) \approx \frac{\mu_0 \mu_m}{l_r} \text{Arctan}(kH) \quad (1)$$

Here, $\mu_0$ is relative magnetic permeability of the core 20a, $\mu_m$ is a maximum relative magnetic permeability of the core, and $l_r$ is a radius of the core.

Also, in Equation 1, a proportional constant k may be defined as expressed by Equation 2.

$$k = \frac{\mu_0 \mu_m}{B_s} \times \frac{\pi}{2} \quad (2)$$

Here, $\mu_0$ is a magnetic permeability of the core 20a, $\mu_m$ is a maximum value of magnetic permeability of the core, and $B_s$ is a magnetic flux density at a saturation stage of the core.

Also, when a current flowing on the circuit, that is, a primary side current is $i_p(t)$ and a secondary side current flowing on the secondary coil is $i_L(t)$, the primary side current, the secondary side current, and the magnetic field intensity H have the following relationship.

$$H(t) = \frac{i_p(t) + Ni_L(t)}{l} \quad (3)$$

Here, $i_p(t)$ denotes a current according to a change in time flowing on the circuit, N denotes the number of turns of the secondary coil, $i_L(t)$ denotes a current obtained by adding a current $i_{OSC}(t)$ according to a change in time supplied to the secondary coil by the oscillation circuit section 61 to $$\frac{i_p(t)}{N},$$

and l denotes a length of the secondary coil.

Thus, through Equations 1 to 3, it can be seen that the magnetic field flux H and the magnetic flux density B are changed by the current $i_{OSC}(t)$ according to a change in time supplied to the secondary coil.

That is, since the magnetic field intensity and the magnetic flux density of the current transformer can be changed by applying an electrical signal to the secondary coil through the oscillation circuit section, the hysteresis loop characteristics of the current transformer can be changed. In particular, when a square wave signal or a high frequency sine wave signal which is rapidly changed according to time is applied to the secondary coil, a slope of the hysteresis loop of the current transformer is increased.

As illustrated in FIG. 2, the oscillation circuit section 61 applies the electrical signal to the secondary coil 20b of the current transformer to increase the slope of the hysteresis loop of the current transformer 20 such that the DC current, as well as the AC current, flowing on the secondary coil is detected.

The electrical signal applied by the oscillation circuit section 61 includes a square wave signal according to an embodiment of the present disclosure. Thus, according to an embodiment of the present disclosure, the oscillation circuit section 61 can be configured as a square wave oscillation circuit section.

The electrical signal applied by the oscillation circuit section 61 includes a sine wave signal of a high frequency according to an embodiment of the present disclosure. Thus, according to an embodiment of the present disclosure, the oscillation circuit section 61 can be configured as a sine wave oscillation circuit section.

When the oscillation circuit section 61 applies a sine wave signal of a low frequency to the secondary coil, the slope of the hysteresis loop of the current transformer 20 is almost similar to the slope of the hysteresis loop of the current transformer 20 in a state that the sine wave signal of a low frequency is not applied to the secondary coil and only an AC flowing on the circuit is induced by the secondary coil and detected. Thus, there is no effect of detecting a DC component flowing on the circuit. Thus, when the oscillation circuit section 61 oscillates a sine wave signal, the oscillation circuit section 61 should oscillate a sine wave signal of a high frequency and applies the signal to the secondary coil so that a DC component, as well as an AC component, flowing on the circuit can be detected through the current transformer.

Also, according to another embodiment of the present disclosure, the oscillation circuit section 61 may be configured to oscillate a waveform of the square wave signals or the sine wave signals having a plurality of predetermined different frequencies and output the waveform selectively. Also, the oscillation circuit section 61 may be configured to output an electrical signal having a corresponding frequency and a corresponding waveform among a square wave and a sine wave in response to a selection control signal from the trip determining circuit section 63. Also, the oscillation circuit section 61 may be configured to stop outputting of the electrical signal when the selection control signal is not received from the trip determining circuit section 63.

The trip determining circuit section 63 compares a current value indicated by the current detection signal having the AC component and the DC component output from the secondary coil 20b of the current transformer 20 with a predetermined reference current value, and outputs a trip control signal when the current value indicated by the current detection signal exceeds the reference current value.

The trip determining circuit section 63 may include an analog-digital converter and a central processing unit (CPU). On the basis of the current detection signal sampled at a certain time and digital-converted by the analog-digital converter, the CPU of the trip determining circuit section 53 may determine a current amount flowing on the circuit.

The trip determining circuit section 63 may be configured to determine a waveform and a frequency of the electrical signal to be supplied to the secondary coil 20b through the oscillation circuit section 61 on the basis of the current detection signal. In detail, it may be a DC having a predetermined value without a change according to the lapse of time in the current value indicated by the current detection signal. Also, when the current value indicated by the current detection signal has characteristics of a mixed waveform of a DC and an AC, that is, when the current detection signal is a signal having a waveform of a mixture of a DC and an AC, an absolute value of a positive maximum value and an absolute value of a negative minimum value in the corresponding waveform are different, and thus, halves of one cycle form asymmetry. When the trip determining circuit section 63 determines that the current value indicated by the current detection signal is a waveform indicating DC characteristics or a waveform in which a DC and a AC are mixed, the trip determining circuit section 63 may transmit a selection control signal to the oscillation circuit section 61 such that a square wave having any one of a plurality of predetermined frequencies or a sine wave of a high frequency.

If the trip determining circuit section 63 determines that the current value indicated by the current detection signal has a waveform of a pure AC component as half-cycle waveforms are symmetrical in one cycle waveform because the absolute value of the positive maximum value and the absolute value of the negative minimum value are the same, the trip determining circuit section 63 may not output a selection control signal to the oscillation circuit section 61 and the oscillation circuit 61 may stop outputting of an electrical signal in response.

Also, the trip determining circuit section 63 according to another embodiment may be configured to determine a signal of a waveform to be output by the oscillation circuit section 61 on the basis of a relationship between a change of a magnetic field intensity by time slots generated in the secondary coil 20b and a change in magnetic flux density corresponding thereto.

To this end, the trip determining circuit section 63 may have a magnetic field sensor and/or a hall sensor (not shown) to provide a signal of a change in magnetic field intensity by time slots generated in the secondary coil 20b and a magnetic flux density corresponding thereto, as a digital signal through the analog-digital converter, and determine a form and a slope of a current hysteresis loop according to the digital signal received.

Thus, the trip determining circuit section 63 compares the determined slope of the current hysteresis loop with a preset reference slope, and when the determined slope of the current hysteresis loop is greater than the preset reference slope, the trip determining circuit section 63 may not output a selection control signal to the oscillation circuit section 61 and the oscillation circuit section 61 may stop outputting of the electrical signal in response. Here, the preset reference slope may be a threshold slope regarding a slope of the hysteresis loop enabling both an AC component and a DC component flowing on the circuit to be detected and may be previously set in a memory included in the trip determining circuit section 63 through a data input device by a user.

Thus, the trip determining circuit section 63 compares the determined slope of the current hysteresis loop with the preset reference slope, and when the determined slope is smaller than the reference slope, the trip determining circuit section 63 outputs a selection control signal selecting a square wave signal having a first frequency, for example, and the oscillation circuit section 61 outputs the square wave signal to the secondary coil 20b such that the slope of the hysteresis loop of the current transformer is increased to enable a DC component, as well as an AC component, flowing on the circuit to be detected.

The trip determining circuit section 63 receives the current detection signal regarding a current including at least one of a DC component and an AC component flowing on the circuit or the current detection signal regarding a composite current of a DC current and an AC current from the secondary coil 20b.

Also, as illustrated in FIG. 3 or 4, the trip determining circuit section 63 according to another embodiment may further include a low pass filter circuit section 63-1. The low pass filter circuit section 63-1 may remove a high frequency component that may be mixed in the current detection signal. Thus, a distorted portion in FIG. 8 as a high frequency component in the current detection signal provided from the secondary coil 20b may be removed by the low pass filter circuit section 63-1.

The trip control circuit for a circuit breaker according to another embodiment of the present disclosure can further comprise a sensing resistor 62 as illustrated in FIG. 3 or 4.

The sensing resistor 62 is connected to the secondary coil 20b of the current transformer 20 and converts and outputs a current signal, as a current detection signal provided by the secondary coil 20b into a voltage signal by an effect of applying resistance to the current signal, that is, by multiplying a resistance value to the value of the current signal.

The trip control circuit for a circuit breaker according to another embodiment of the present disclosure may further comprise a first display unit 64 and a second display unit 65 as illustrated in FIG. 4.

The first display unit 64 can display a magnetic flux density and a magnetic field intensity of the secondary coil corresponding to the signal applied by the oscillation circuit section to the secondary coil. Here, as described above, the trip determining circuit section 63 can receive a change in a magnetic field intensity by time slots generated in the secondary coil 20b and a magnetic flux density corresponding thereto as a digital signal through the analog-digital converter from the magnetic field sensor and/or the hall sensor, and thus, the information of the magnetic flux density and the magnetic field intensity of the secondary coil may be provided from the trip determining circuit section 63 to the first display unit 64 so as to be displayed.

When a DC component flowing on the circuit passing through the ring core of the current transformer is detected, the second display unit 65 may display information indicating detection of the DC component.

As described above, when the current value indicated by the current detection signal represents pure DC characteristics having a uniform value without a change according to the lapse of time or when the current value indicated by the current detection signal represents characteristics of a mixed waveform of a DC and an AC, the trip determining circuit section 63 may determine that a DC component is detected from the current flowing on the circuit, and provide corresponding information to the second display unit 65. Here, the information may be information having contents of a message such as "DC component has been detected", for example.

Also, when the trip determining circuit section 63 determines that half cycle waveforms in one cycle waveform of the current detection signal are symmetrical and thus a waveform indicated by the current detection signal is a waveform of a pure AC component, the trip determining circuit section 63 may determine that a DC component is not detected in the current flowing on the circuit and provide corresponding information to the second display unit 65. Here, the information may be information having contents of a message such as "No DC component has been detected", for example.

According to an embodiment, the first display unit 65 and the second display unit 65 may be configured as a single liquid crystal display (LCD), and the corresponding LCD may be configured such that a selective input regarding display information is interfaced by a selection input unit such as a key switch or a selection button switch (not shown).

In FIG. 2, reference numeral 30 denotes a trip mechanism such as a magnetic trip device.

The corresponding trip mechanism 30 may include a plunger, for example, as an output member and a coil for driving the output member by a magnetic force.

In FIG. 2, reference numeral 40 denotes a switching mechanism including a fixed contact, a movable contact and mechanical parts for driving the movable contact in the circuit breaker, and reference numeral 50 denotes an electrical load.

On the other hand, an operation of the trip control circuit for a circuit breaker according to an embodiment of the present disclosure configured as described above will be described with reference to FIGS. 2 to 8.

Figure 5:
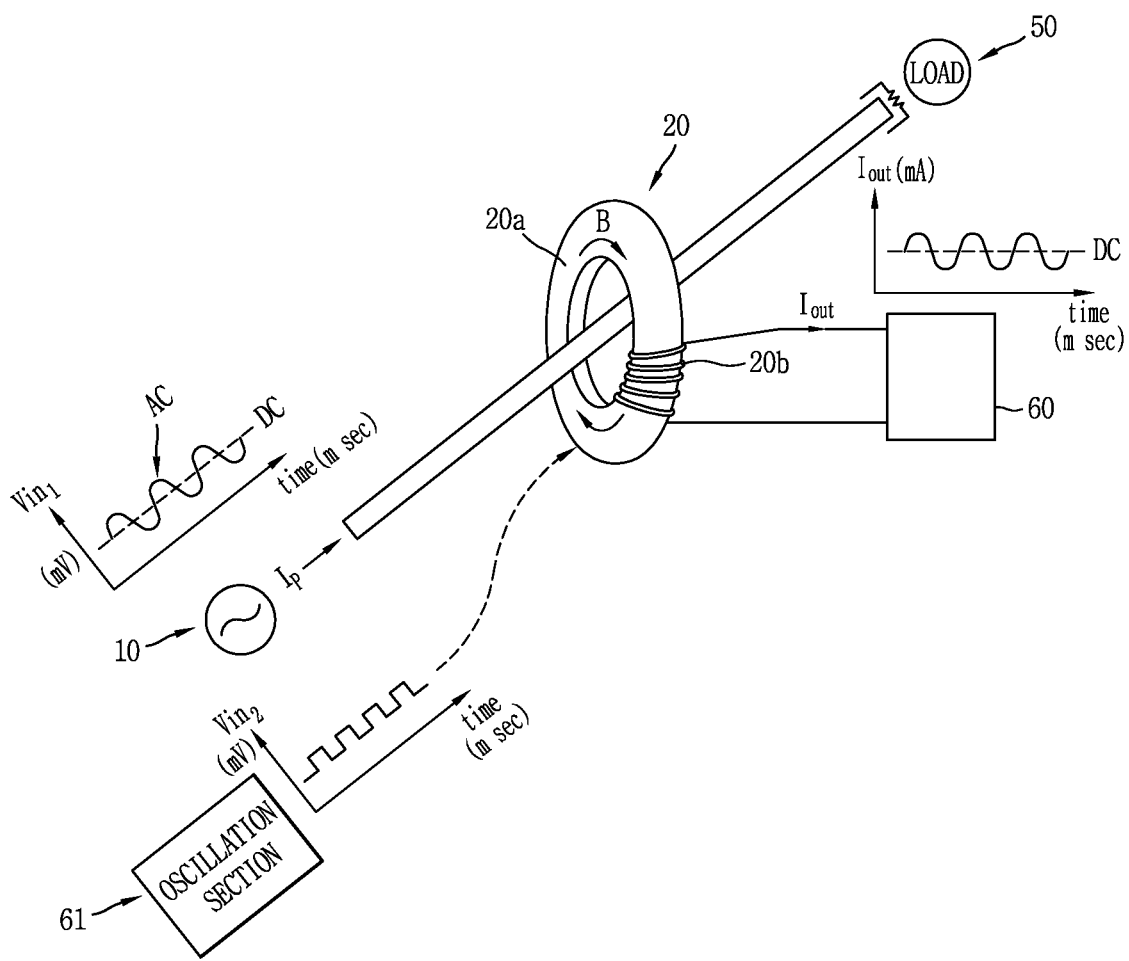
FIG. 5 is a block diagram and a signal waveform view illustrating a signal processing operation of a trip control circuit for a circuit breaker according to the present disclosure.

As illustrated in FIG. 2 or 5, when a current flowing on the circuit passing through the core 20a of the current transformer 20 is a primary current Ip or i1 or i2, the primary current Ip or i1 or i2 may include an AC component and a DC component.

The primary current Ip or i1 or i2 flowing on the circuit is detected by the secondary coil 20b and provided to the trip determining circuit section 63 as the current detection signal.

When the trip determining circuit section 63 determines that the current value indicated by the current detection signal is a waveform indicating DC characteristics or a waveform in which a DC and a AC are mixed on the basis of the current detection signal, the trip determining circuit section 63 may transmit a selection control signal to the oscillation circuit section 61 such that a square wave having any one of a plurality of predetermined frequencies or a sine wave of a high frequency.

If the trip determining circuit section 63 determines that the current value indicated by the current detection signal has a waveform of a pure AC component, the trip determining circuit section 63 may not output a selection control signal to the oscillation circuit section 61 and the oscillation circuit 61 may stop outputting of an electrical signal in response.

Then, the oscillation circuit section 61 oscillates and outputs an electrical signal of a square wave having any one of a plurality of frequencies or a high frequency sine wave corresponding to the selection control signal, and the electrical signal is provided to the secondary coil 20b. As illustrated in FIG. 6, the electrical signal of the square wave or the high frequency sine wave increases a first slope S1 of a first hysteresis loop HL1 of the current transformer 20 indicated by the dotted line to change hysteresis characteristics of the current transformer 20 to have a second slope S2 of a second hysteresis loop HL2.

Thus, a DC current (DC current component), as well as an AC current, flowing on the circuit is detected in the secondary coil 20b of the current transformer 20.

The trip determining circuit section 63 compares a current value indicated by the current detection signal having the AC component and the DC component output from the secondary coil 20b of the current transformer 20 with a predetermined reference current value, and when the current value indicated by the current detection signal exceeds the reference current value, the trip determining circuit section 63 outputs a trip control signal.

When the current value indicated by the current detection signal is smaller than the reference current value on the basis of the comparison result, the trip determining circuit section 63 does not output a trip control signal.

The trip control signal magnetizes a coil included in the trip mechanism such as a magnetic trip device 30 and triggers the switching mechanism 40 by moving an output member, for example, a plunger. Then, the switching mechanism 40 including the movable contact and the fixed contact operates to a circuit opening position to break the circuit, that is, perform a trip operation.

The other embodiment of the present disclosure illustrated in FIG. 3 is different from the aforementioned embodiment in that the sensing resistor 62 and the low pass filter circuit section 63-1 are added.

Thus, only an operation related to the sensing resistor 62 and the low pass filter circuit section 63-1 will be described.

The sensing resistor 62 forms a voltage by resistance thereof upon a current signal as a current detection signal provided by the secondary coil 20b and converts the current signal into a voltage signal and provides the converted voltage signal to the trip determining circuit section 63.

The low pass filter circuit section 63-1 removes a high frequency component that may be mixed in the current detection signal. Thus, as illustrated in FIG. 8, a distorted portion as a high frequency component included in the current detection signal provided by the secondary coil 20b is removed by the low pass filter circuit section 63-1.

Another embodiment of the present disclosure illustrated in FIG. 4 is different from the aforementioned embodiments in that the first display unit 64 and the second display unit 65 are further provided.

Thus, in order to avoid repeated descriptions, only an operation related to the first display unit 64 and the second display unit 65 will be described.

As described above, the trip determining circuit section 63 may receive the change in the magnetic field intensity by time slots generated in the secondary coil 20b and a signal of a corresponding magnetic flux density, as a digital signal from the magnetic field sensor (not shown) and/or the hall sensor (not shown) through the analog-digital converter, and thus, the information of the magnetic flux density and the magnetic field intensity of the secondary coil is provided from the trip determining circuit section 63 to the first display unit 64.

The first display unit 64 can display the magnetic flux density and the magnetic field intensity of the secondary coil provided by the trip determining circuit section 63.

When the current value indicated by the current detection signal represents pure DC characteristics having a predetermined value without a change according to the lapse of time or when the current value indicated by the current detection signal represents the characteristics of a mixed waveform of a DC and an AC, the trip determining circuit unit 63 determines that a DC component is detected in the current flowing on the circuit, and provides corresponding information to the second display unit 65.

Then, the second display unit 65 displays information indicating that the DC component is detected, as a message having contents such as "DC component has been detected", for example.

Also, when the trip determining circuit section 63 determines that a waveform represented by the current detection signal according to the current value is a waveform of a pure AC component, the trip determining circuit section 63 may determine that a DC component is not detected in the current flowing on the circuit, and provide corresponding information to be displayed on the second display unit 65. Thus, the second display unit 65 may display information having contents of a message such as "No DC component has been detected", for example.

Also, when the user inputs selection regarding display information through the aforementioned selection input unit electrically connected to the trip determining circuit section 63, the trip determining circuit section 63 displays display information through a liquid crystal display, for example, forming the first display unit 64 and the second display unit 65 according to display information selection input of the user.

For example, when the user requests to display information of a magnetic flux density and a magnetic field intensity of the current transformer 20 according to a current flowing on the circuit through the aforementioned selection input unit, the trip determining circuit section 63 controls the liquid crystal display, for example, forming the first display unit 64 to display the corresponding information.

For example, when the user requests to display information indicating whether a DC component is present in the current flowing on the circuit through the aforementioned selection input unit, the trip determining circuit section 63 displays the corresponding information through the liquid crystal display forming the second display unit 65.

As described above, since the trip control circuit for a circuit breaker according to the present disclosure comprises the oscillation circuit section applying an electrical signal to the secondary coil of the current transformer, an effect that the secondary coil detects a DC current, as well as an AC current, flowing on the circuit by increasing a slope of the hysteresis loop of the current transformer is obtained.

As described above, since the trip control circuit for a circuit breaker according to the present disclosure further comprises a sensing resistor converting a current signal as a current detection signal provided by the secondary coil into a voltage signal and outputting the converted voltage signal, an effect of inputting the current detection signal as a voltage signal to the trip determining circuit and comparing the voltage signal with a reference voltage for determining trip may be obtained.

In the trip control circuit for a circuit breaker according to the present disclosure, since the electrical signal applied by the oscillation circuit section includes a rapidly changing square wave signal or a sine wave signal of a high frequency, when the corresponding electrical signal is applied to the secondary coil through the oscillation circuit section, a magnetic field intensity and a magnetic flux density of the current transformer may be changed and hysteresis loop characteristics of the current transformer may be changed. In particular, the effect that a slope of the hysteresis loop of the current transformer is increased by the rapidly changing square wave signal or sine wave signal of a high frequency is obtained.

In the trip control circuit for a circuit breaker according to the present disclosure, since the trip determining circuit section is configured to determine a current amount flowing on the circuit according to a change in time on the basis of the current detection signal, it is possible to determine whether a current flowing on the circuit in accordance with the current detection signal is a pure AC or a pure DC or a mixed wave of an AC and a DC according to a change in a waveform of the current detection signal based on a change in time, and an effect of determining a waveform and a frequency of an electrical signal to be supplied to the secondary coil through the oscillation circuit section according to the current detection signal may be obtained.

In the trip control circuit for a circuit breaker according to the present disclosure, since the trip determining circuit section is configured to a signal of a waveform to be output by the oscillation circuit unit on the basis of a relationship between a change in a magnetic field intensity by time slots generated in the secondary coil and a change in a magnetic flux density corresponding thereto, the trip determining circuit section can output a corresponding selection control signal to the oscillation circuit section such that the oscillation circuit section outputs a square wave signal of a corresponding frequency or a sine wave signal of a corresponding high frequency according to a slope of the hysteresis loop of the current transformer.

Since the trip control circuit for a circuit breaker according to the present disclosure further comprises the first display unit, an effect that the oscillation circuit section displays a magnetic flux density and a magnetic field intensity of the secondary coil corresponding to a signal applied to the secondary coil may be obtained.

Since the trip control circuit for a circuit breaker according to the present disclosure further comprises the second display unit, when a DC component flowing on the circuit passing through the ring shaped core of the current transformer is detected, the trip control circuit may obtain an effect of displaying information indicating that the DC component is detected.

In the trip control circuit for a circuit breaker according to the present disclosure, since the trip determining circuit section receives a current detection signal detecting a DC current or an AC current or a mixed current of a DC and an AC flowing on the circuit from the secondary coil, the trip determining circuit section can break the circuit when a fault occurs in the DC, the AC, and the composite signal on the basis of the received signal.

In the trip control circuit for a circuit breaker according to the present disclosure, since the trip determining circuit section includes the low pass filter circuit section, a high frequency signal that may be mixed in a signal of a current induced by the secondary coil is removed to minimize generation of an error in determining trip in accordance with high frequency noise.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

What is claimed is:

1. A trip control circuit for a circuit breaker, the trip control circuit comprising:
    a current transformer that has a ring-shaped core allowing a circuit to pass through and a secondary coil wound around the core for detecting a current flowing on the circuit and providing a current detection signal;
    an oscillation circuit section that is configured to apply an electrical signal to the secondary coil of the current transformer to increase a slope of a hysteresis loop of the current transformer to allow the secondary coil to detect a DC current, as well as an AC current, flowing on the circuit; and
    a trip determining circuit section that is configured to compare a current value indicated by the current detection signal having an AC component and a DC component output from the secondary coil of the current transformer with a predetermined reference current value, and output a trip control signal when the current value indicated by the current detection signal exceeds the reference current value, and
    wherein the trip determining circuit section is configured to determine a current amount flowing on the circuit according to a change in time on the basis of the current detection signal, and determine a waveform and a frequency of the electrical signal to be supplied to the secondary coil through the oscillation circuit section.

2. The trip control circuit of claim 1, further comprising a sensing resistor connected to the secondary coil of the current transformer that converts a current signal as a current detection signal provided by the secondary coil into a voltage signal, and outputs the converted voltage signal.

3. The trip control circuit of claim 1, wherein the electrical signal applied by the oscillation circuit section is configured with a square wave signal.

4. The trip control circuit of claim 1, wherein the electrical signal applied by the oscillation circuit section is configured with a sine wave signal having high frequency.

5. The trip control circuit of claim 1, wherein the trip determining circuit section is configured to determine a signal of a waveform to be output by the oscillation circuit section on the basis of a relationship between a change in a magnetic field intensity generated in the secondary coil as time passed and a change in a magnetic flux density corresponding thereto.

6. The trip control circuit of claim 1, further comprising a first display unit that displays a magnetic flux density and a magnetic field intensity of the secondary coil corresponding to a signal applied by the oscillation circuit section to the secondary coil.

7. The trip control circuit of claim 1, further comprising a second display unit that is configured to display an information indicating that a DC component is detected, when the DC component flowing on the circuit passing through the core of the current transformer is detected.

8. The trip control circuit of claim 1, wherein the trip determining circuit section is configured to receive a current detection signal from the secondary coil which has detected a current including at least one of a DC current component and an AC current component flowing on the circuit or a mixed current of the DC current and the AC current.

9. The trip control circuit of claim 1, wherein the trip determining circuit section comprises a low pass filter circuit section that removes a high frequency signal that may be mixed in the current detection signal for a current induced to the secondary coil.

* * * * *